(12) United States Patent
Tekumalla et al.

(10) Patent No.: US 8,677,200 B2
(45) Date of Patent: Mar. 18, 2014

(54) INTEGRATED CIRCUIT WITH TRANSITION CONTROL CIRCUITRY FOR LIMITING SCAN TEST SIGNAL TRANSITIONS DURING SCAN TESTING

(75) Inventors: Ramesh C. Tekumalla, Breinigsville, PA (US); Prakash Krishnamoorthy, Bethlehem, PA (US)

(73) Assignee: LSI Corporation, San Jose, CA (US)

(*) Notice: Subject to any disclaimer, the term of this patent is extended or adjusted under 35 U.S.C. 154(b) by 195 days.

(21) Appl. No.: 13/228,097

(22) Filed: Sep. 8, 2011

(65) Prior Publication Data

US 2013/0067290 A1 Mar. 14, 2013

(51) Int. Cl.
*G01R 31/28* (2006.01)

(52) U.S. Cl.
USPC .......................... 714/726; 714/734; 714/729

(58) Field of Classification Search
USPC .................. 714/726, 734, 727, 724, 733, 729
See application file for complete search history.

(56) References Cited

U.S. PATENT DOCUMENTS

| | | | |
|---|---|---|---|
| 7,055,118 B1 * | 5/2006 | Kamepalli et al. | 716/107 |
| 7,128,270 B2 * | 10/2006 | Silverbrook et al. | 235/472.01 |
| 7,277,803 B2 | 10/2007 | Thirunavukarasu et al. | |
| 7,562,275 B2 * | 7/2009 | Juhn et al. | 714/726 |
| 7,594,149 B2 * | 9/2009 | Pilling | 714/726 |
| 7,653,849 B1 * | 1/2010 | Tabatabaei | 714/726 |
| 2008/0072112 A1 | 3/2008 | Varadarajan et al. | |

OTHER PUBLICATIONS

K.M. Butler et al., "Minimizing Power Consumption in Scan Testing: Pattern Generation and DFT Techniques," IEEE Proceedings—International Test Conference, Oct. 2004, pp. 355-364.

T-C. Huang et al "Reduction of Power Consumption in Scan-Based Circuits During Test Application by an Input Control Technique," IEEE Transactions on Computer Aided Design of Integrated Circuits and Systems, Jul. 2001, pp. 911-917, vol. 20, No. 7.

D. Czysz et al., "Low Power Scan Shift and Capture in the EDT Environment," IEEE, International Test Conference, 2008, Paper 13.2, 10 pages.

N. Nicolici et al., "Minimisation of Power Dissipation During Test Application in Full Scan Sequential Circuits Using Primary Input Freezing," IEEE Proceedings—Computers and Digital Techniques, Oct. 2000, 24 pages, vol. 147, No. 5.

A. Sabne et al,, "A Generic Low Power Scan Chain Wrapper for Designs Using Scan Compression," IEEE VLSI Test Symposium, Apr. 2010, pp. 135-140.

(Continued)

*Primary Examiner* — Fritz Alphonse
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises transition control circuitry configured to detect transitions between binary logic levels in a scan test signal, and responsive to a number of detected transitions reaching a threshold, to limit further transitions associated with a remaining portion of the scan test signal. In an illustrative embodiment, the transition control circuitry limits further transitions associated with the remaining portion of the scan test signal by replacing at least part of the remaining portion of the scan test signal with a limited transition signal. The limited transition signal may be maintained at a constant binary logic level such that it has no transitions. By limiting the number of transitions associated with the scan test signal, the transition control circuitry serves to reduce integrated circuit power consumption during scan testing.

20 Claims, 5 Drawing Sheets

(56) References Cited

OTHER PUBLICATIONS

S. Vishwanath et al., "Fan-Out Statistical Power Estimation Based Scan Cell Gating for Combinational Shift Power Reduction," in (Online) Proc. SNUG, 2009, 19 pages, Bangalore, India.

Synopsys, Inc., "TetraMAX ATPG User Guide," Version D-2010.03, Mar. 2010, 779 pages.

M. Elshoukry et al., "Partial Gating Optimization for Power Reduction During Test Application," IEEE Proceedings of the 14th Asian Test Symposium, 2005, 4 pages.

T. Yoshida et al., "A New Approach for Low Power Scan Testing," IEEE International Test Conference, Paper 18.2, 2003, pp. 480-487.

R. Sankaralingam et al., "Controlling Peak Power During Scan Testing," Proceedings of the 20th IEEE VLSI Test Symposium, 2002, 7 pages.

Lee Whetsel, "Adapting Scan Architectures for Low Power Operation," Proceedings of the IEEE International Test Conference, Oct. 2000, pp, 863-872.

\* cited by examiner

INTEGRATED CIRCUIT WITH TRANSITION CONTROL CIRCUITRY FOR LIMITING SCAN TEST SIGNAL TRANSITIONS DURING SCAN TESTING

FIELD OF THE INVENTION

The present invention relates generally to integrated circuit testing, and more particularly to scan test circuitry for use in integrated circuit testing.

BACKGROUND OF THE INVENTION

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results. A given one of the flip-flops of the scan chain may be viewed as an example of what is more generally referred to herein as a "scan cell."

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. However, the use of high levels of scan compression can adversely impact diagnostic resolution, that is, the ability to attribute a particular failure to an exact fault or set of faults within the combinational logic. As a result, when using scan compression, a tradeoff exists between compression level and diagnostic resolution. Additional details regarding compressed scan testing are disclosed in U.S. Pat. No. 7,831,876, entitled "Testing a Circuit with Compressed Scan Subsets," which is commonly assigned herewith and incorporated by reference herein.

A significant problem that can arise in both compressed and noncompressed scan testing relates to the power consumption of the integrated circuit during scan testing. It is important that the test patterns generated and applied to the integrated circuit by a tester do not cause the integrated circuit to exceed its maximum power. A typical conventional approach to controlling scan test power consumption is implemented in software and performed during test pattern generation. Such an approach generally involves identifying test patterns that violate peak power limitations and then modifying those patterns before they are applied to the integrated circuit. An example of an approach of this type is described in R. Sankaralingam et al., "Controlling peak power during scan testing," Proc. VLSI Test Symposium, 2002. However, this approach does not provide a sufficient level of controllability during the scan test itself. For example, it does not allow dynamic adjustment of the power consumption associated with particular applied scan test signals during scan testing.

SUMMARY OF THE INVENTION

Illustrative embodiments of the invention provide a substantial improvement in scan testing by controllably limiting the number of transitions associated with a given scan test signal in conjunction with application of scan test input data from that scan test signal to one or more scan chains of an integrated circuit.

In one aspect, an integrated circuit comprises scan test circuitry and additional circuitry subject to testing utilizing the scan test circuitry. The scan test circuitry comprises transition control circuitry configured to detect transitions between binary logic levels in a scan test signal, and responsive to a number of detected transitions reaching a threshold, to limit further transitions associated with a remaining portion of the scan test signal. By way of example, the transition control circuitry may limit further transitions associated with the remaining portion of the scan test signal by replacing at least part of the remaining portion of the scan test signal with a limited transition signal. The limited transition signal may be maintained at a constant binary logic level such that it has no transitions, although a wide variety of other types of limited transition signals may be used in other embodiments. The transition control circuitry may illustratively comprise multiplexing circuitry configured to select between the scan test signal and the limited transition signal responsive to the number of detected transitions reaching the threshold.

The transition control circuitry may comprise a plurality of transition controllers for respective ones of a plurality of scan test signals associated with respective scan channels of the integrated circuit, with each of the transition controllers being configured to detect transitions between binary logic levels in a corresponding one of the scan test signals, and responsive to a number of detected transitions in that scan test signal reaching a threshold, to limit further transitions associated with a remaining portion of the scan test signal. The thresholds may be set by values stored in respective threshold registers of the transition controllers, and may be defined separately for each of the scan test signals. Also, the transition controllers may be separately enabled and disabled for the various scan channels.

The scan test circuitry in one or more of the illustrative embodiments may further comprise a decompressor, a compressor, and a plurality of scan chains arranged in parallel with one another between respective outputs of the decompressor and respective inputs of the compressor, with the above-noted transition controllers being associated with respective inputs of the decompressor. The scan test signals, as modified by any transition limitations implemented by the respective transition controllers, are applied to respective inputs of the decompressor. Scan test input data from the decompressor based on the modified scan test signals is shifted into the scan chains for use in the scan testing, and scan test output data indicative of results of the scan testing is subsequently shifted out of the scan chains into the compressor. The transition count thresholds utilized by the transition controllers may be determined as a function of the number of scan cells in a given one of the scan chains.

Advantageously, by limiting the number of transitions associated with one or more scan test signals, the transition control circuitry serves to reduce integrated circuit power consumption during scan testing. This reduction in scan test power consumption can be achieved without any significant negative impact on integrated circuit area requirements or functional timing requirements. Test patterns can be generated in a manner that takes the operation of the transition control circuitry into account, and expected scan test responses determined accordingly, in an otherwise conventional test generation tool.

DETAILED DESCRIPTION OF THE INVENTION

The invention will be illustrated herein in conjunction with exemplary testing systems and corresponding integrated circuits comprising scan test circuitry for supporting scan testing of other internal circuitry of those integrated circuits. It should be understood, however, that the invention is more generally applicable to any testing system or associated integrated circuit in which it is desirable to provide accurate and efficient control of integrated circuit power consumption during scan testing.

Figure 1:
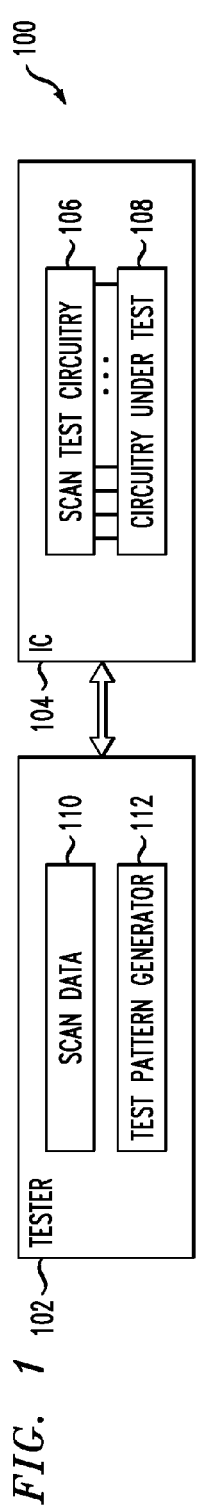
FIG. 1 is a block diagram showing an integrated circuit testing system comprising a tester and an integrated circuit under test in an illustrative embodiment.

FIG. 1 shows a testing system 100 comprising a tester 102 and an integrated circuit under test 104. The integrated circuit 104 comprises scan test circuitry 106 that is coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and the invention is not limited in this regard. However, the illustrative embodiments such as those shown in FIGS. 2 and 3 will be described primarily in the context of compressed scan testing.

Figure 2:
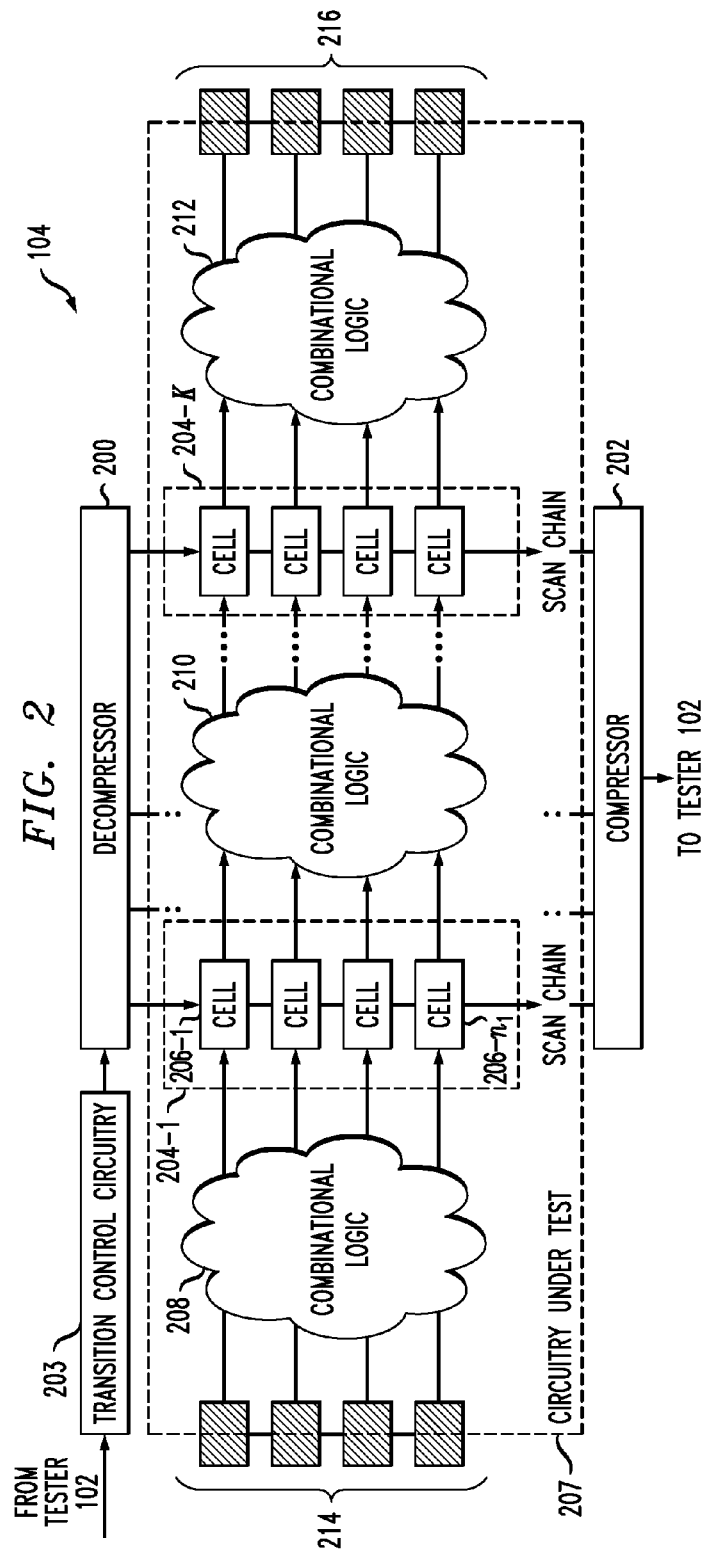
FIG. 2 illustrates one example of the manner in which scan chains of scan test circuitry may be arranged between combinational logic in the integrated circuit of FIG. 1.

Referring now to FIG. 2, portions of one potential configuration of the integrated circuit 104 are shown in greater detail. In this compressed scan testing arrangement, the scan test circuitry 106 comprises a decompressor 200, a compressor 202, transition control circuitry 203, and a plurality of scan chains 204-$k$, where k=1, 2, ... K. Each of the scan chains 204 comprises a plurality of scan cells 206, and is configurable to operate as a serial shift register in a scan shift mode of operation of the integrated circuit 104 and to capture functional data from circuitry under test 207 in a functional mode of operation of the integrated circuit 104.

The scan chains 204 are arranged in parallel with one another between respective outputs of the decompressor 200 and respective inputs of the compressor 202, such that in the scan shift mode of operation, scan test input data from the decompressor 200 is shifted into the scan chains 204 and scan test output data is shifted out of the scan chains 204 into the compressor 202.

The first scan chain 204-1 is of length $n_1$ and therefore comprises $n_1$ scan cells denoted 206-1 through 206-$n_1$. More generally, scan chain 204-$k$ is of length $n_k$ and therefore comprises a total of $n_k$ scan cells.

Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the scan chains 204.

Combinational logic blocks such as 208, 210 and 212 may be viewed as examples of what are more generally referred to herein as "additional circuitry" that is subject to testing utilizing scan test circuitry in embodiments of the present invention. By way of example, such blocks may represent portions of different integrated circuit cores, such as respective read channel and additional cores of a system-on-chip (SOC) integrated circuit in a hard disk drive (HDD) controller application, designed for reading and writing data from multiple hard disk drives. In other embodiments, the circuit blocks subject to testing by the scan chains may comprise other types of functional logic circuitry, in any combination, and the term "additional circuitry" is intended to be broadly construed so as to cover any such arrangements of logic circuitry.

The decompressor 200 receives compressed scan data from the tester 102 and decompresses that scan data to generate scan test input data that is shifted into the scan chains 204 when such chains are configured as respective serial shift registers in the scan shift mode of operation. The compressor 202 receives scan test output data shifted out of the scan chains 204, also when such chains are configured as respective serial shift registers in the scan shift mode of operation, and compresses that scan test output data for delivery back to the tester 102. Additional details regarding the operation of scan compression elements such as decompressor 200 and compressor 202 may be found in the above-cited U.S. Pat. No. 7,831,876. Again, scan compression elements such as decompressor 200 and compressor 202 may be eliminated in other embodiments.

As indicated previously, a problem that can arise in an integrated circuit comprising scan test circuitry relates to excessive integrated circuit power consumption during scan testing. The scan test circuitry 106 in the present embodiment addresses the issue of excessive power consumption by dynamically limiting the number of transitions in scan test signals applied to the inputs of the decompressor 200. This functionality is implemented by the transition control circuitry 203, which is generally configured to detect transitions between binary logic levels in at least one scan test signal, and responsive to a number of detected transitions reaching a threshold, to limit further transitions associated with a remaining portion of that scan test signal. By way of example, the transition control circuitry 203 may limit the further transitions associated with the scan test signal by replacing at least part of the remaining portion of the scan test signal with a limited transition signal.

In illustrative embodiments, the limited transition signal has a constant logic level and therefore no signal transitions, but in other embodiments the limited transition signal may include one or more transitions. The term "limited transition signal" as used herein is therefore intended to encompass a variety of non-constant signals that nonetheless have substantially fewer transitions than the associated part of the corresponding scan test signal.

Figure 3:
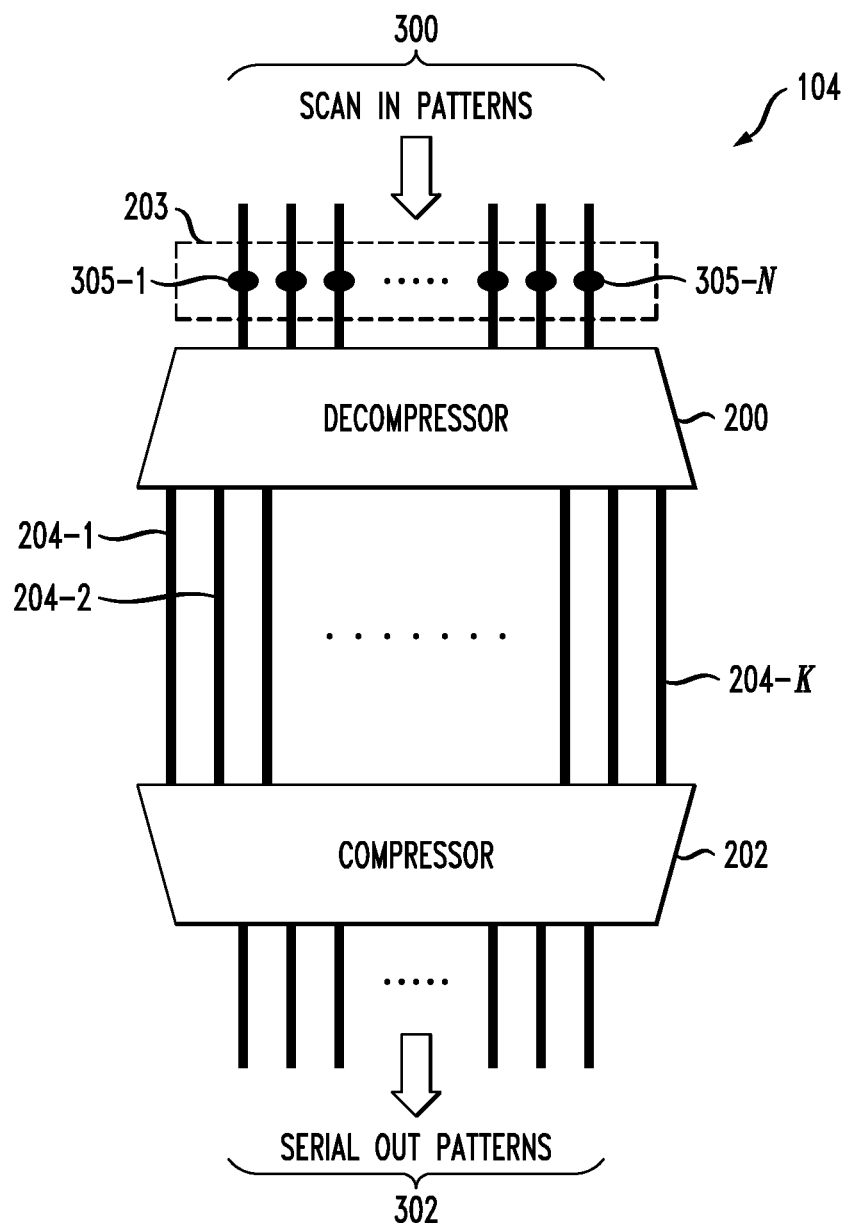
FIG. 3 shows another view of the scan test circuitry of FIG. 2 illustrating the implementation of transition control circuitry within the scan test circuitry.

FIG. 3 shows the scan test circuitry 106 in greater detail. Compressed scan input data is applied by tester 102 to N scan inputs 300 of decompressor 200, and compressed scan output data is provided from compressor 202 back to tester 102 via N scan outputs 302. The K scan chains 204 are arranged in parallel between respective outputs of the decompressor 200 and respective inputs of the compressor 202 as shown. Each of the individual scan chains 204 is configurable to operate as a serial shift register in the scan shift mode of operation of the integrated circuit 104 and also to capture functional data from combinational logic elements in the functional mode of operation of the integrated circuit 104.

The number K of scan chains 204 is generally much larger than the number N of scan test outputs of the compressor 202. The ratio of K to N provides a measure of the degree of scan test pattern compression provided in the scan test circuitry 106. It should be noted, however, that the number of compressor outputs need not be the same as the number of decompressor inputs. For example, there may be N decompressor inputs and L compressor outputs, where $N \neq L$ but both N and L are much smaller than K.

In a typical implementation, the lengths of the scan chains 204 are balanced so that the same amount of time is needed to shift the desired set of scan test patterns into all of the scan chains. It may therefore be assumed without limitation that all of the scan chains 204 are of length n, such that $n_1 = n_2 = \ldots = n_K = n$. It should be noted that the variable n as used in this context of the length of the scan chains 204 is different than the variable n used elsewhere herein in the transition counter context.

As illustrated in FIG. 3, the transition control circuitry 203 comprises a plurality of transition controllers 305-1 through 305-N, with one such transition controller inserted in series with each of the N scan inputs of the decompressor 200. The scan inputs of the decompressor 200 may be viewed as corresponding to respective ones of what are more generally referred to herein as "scan channels" of the integrated circuit 104.

In an embodiment without scan compression, where the decompressor 200 and compressor 202 are eliminated, the scan channels may correspond to respective ones of the scan chains 204, such that there is a separate transition controller for each of the scan chains. The scan test signals in an embodiment of this type may be applied from the tester 102 to the scan chains 204 via the respective transition controllers 305. Although a separate transition controller 305 may be used for each scan chain 204 even in an embodiment with scan compression, with the transition controllers being arranged in series with respective outputs of the decompressor 200, this would require significantly more integrated circuit area, since as noted above K is typically much larger than N.

The term "scan test signal" as used herein is intended to be broadly construed, and may encompass, by way of example, a signal applied to a scan data input of a decompressor, or another signal applied to another type of scan channel, such as a signal applied to a scan data input of a scan chain.

Although in the FIG. 3 embodiment each of the inputs of the decompressor 200 has an associated transition controller, in other embodiments transition controllers need not be provided in every scan channel. For example, the transition controllers may be implemented only in a subset of the scan channels that are known to exhibit sufficiently high transition activity in their respective scan test signals.

Each of the transition controllers 305 is generally configured to detect transitions between binary logic levels in a corresponding one of the scan test signals, and responsive to a number of detected transitions in that scan test signal reaching a threshold, to limit further transitions in a remaining portion of that scan test signal. In the present embodiment, each transition controller 305 limits further transitions in the scan test signal applied to its corresponding input of the decompressor 200 by replacing at least part of a remaining portion of the scan test signal with a limited transition signal.

More particularly, a given transition controller 305 counts the number of binary logic level transitions in the scan test signal applied by the tester 102 to the corresponding input of the decompressor 200, and when the count reaches a specified threshold, the transition controller modifies the applied scan test signal by causing a constant input stream to be shifted into the associated scan channel from that point on. As a result, the number of transitions in the remaining portion of the scan test signal after the transition count threshold is reached is limited, in this particular case to substantially zero further transitions.

The threshold may be chosen as a function of the length n of the scan chains 204. For example, in one possible implementation in which the scan chains 204 are each of length n=296 scan cells, a suitable threshold may be selected as n/2=148. In this case, the threshold of 148 transitions is selected out of a maximum possible 296 transitions that could potentially be encountered in any scan pattern. However, it is to be appreciated that the threshold or thresholds used in a given embodiment should be defined for the integrated circuit based on factors such as power dissipation budget, thermal time constant of the integrated circuit package, package power dissipation limit, peak regulator current supply limit, etc. The term "threshold" as used herein is intended to be broadly construed, and should not be interpreted as being limited to any particular value or range of values.

By limiting the number of transitions associated with the scan test signals applied to the inputs of the decompressor 200, the transition control circuitry 203 serves to reduce the power consumption of the integrated circuit 104 during scan testing. This reduction in scan test power consumption is fully automated, and is controllable by adjustment of the operating parameters of the transition controller and its associated transition count threshold for each scan channel. It therefore allows dynamic adjustment of the power consumption associated with particular applied scan test signals during scan testing.

The limiting of scan test signal transitions in the present embodiment may be viewed as limiting transitions within a given scan vector, where a scan vector comprises a shift-in phase in which scan test input data is shifted into all of the scan chains 204, followed by a capture phase in which functional data is captured, followed by a shift-out phase in which scan test output data is shifted out from all of the scan chains 204. The peak switching activity leading to power consumption in the integrated circuit typically happens during the shift-in and shift-out phases of the scan vector. As will be described below, the transition controllers 305 are configured to reset their transition counts after each scan vector.

It should be noted that limiting further transitions associated with a remaining portion of a scan test signal after a transition count threshold has been reached can also reduce the test coverage, as certain patterns may no longer be exercised during scan testing. However, the possible need for an increased number of test patterns can be balanced against the reductions in power dissipation that are achieved.

Figure 4:
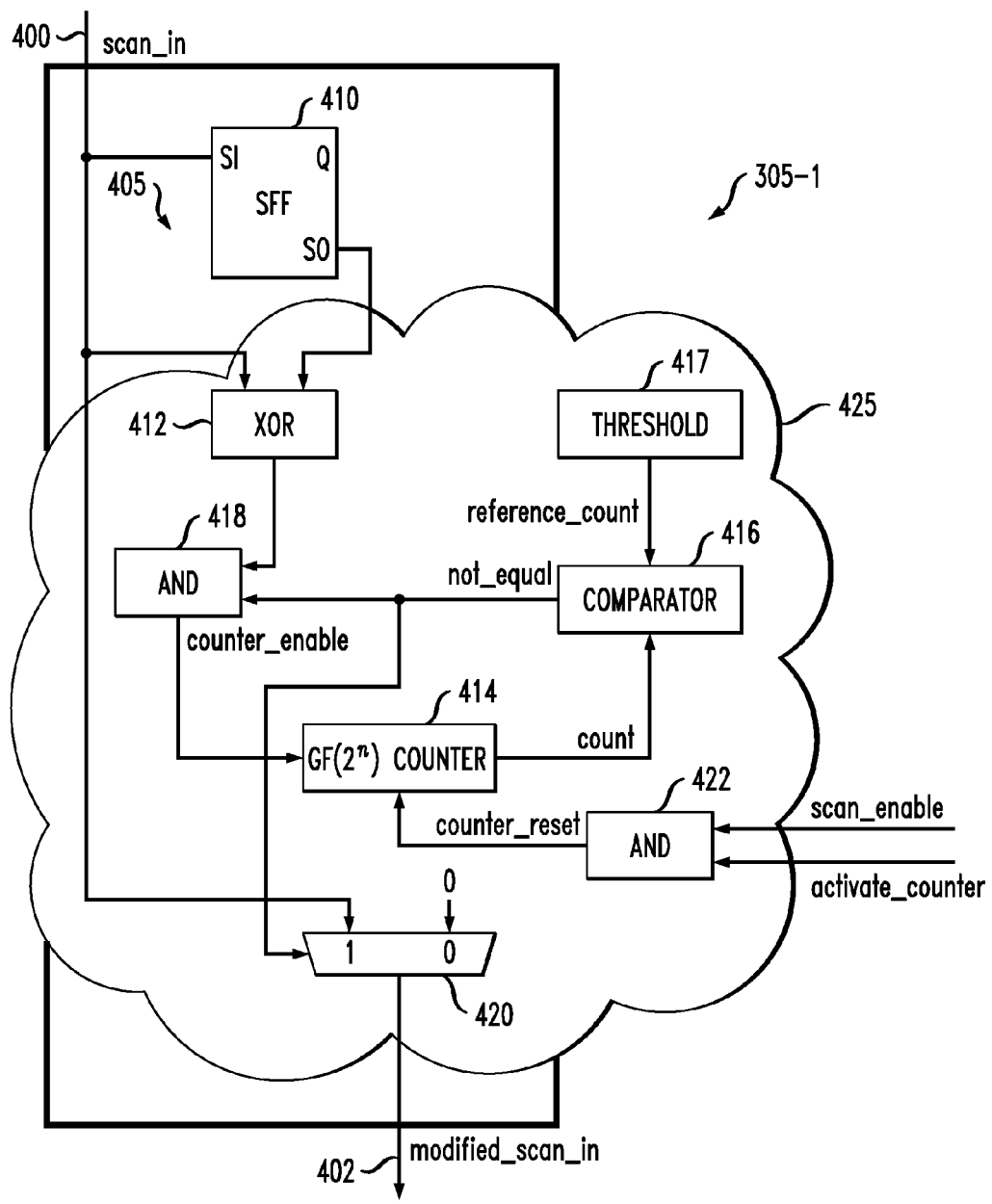
FIG. 4 is a schematic diagram showing a portion of the transition control circuitry associated with a particular input of the decompressor in the scan test circuitry of FIG. 3.

FIG. 4 shows a given one of the transition controllers 305-1 in greater detail. The transition controller has a scan test input 400 which receives a scan test signal scan_in from the tester 102 and a scan test output 402 which provides a modified version of the scan test signal denoted modified_scan_in for delivery to a corresponding input of the decompressor 200. The modified version of the scan test signal exhibits a reduced number of transitions after a point at which the number of transitions in the scan test signal reaches the specified threshold. More specifically, in the present embodiment, the modified version of the scan test signal exhibits substantially no transitions after that point.

This is achieved in the present embodiment by the transition controller 305-1 replacing the remaining portion of the scan test signal, after the threshold is reached, with a limited transition signal that is maintained at a constant binary logic level (e.g., a logic "1" level or a logic "0" level) and therefore has no transitions. Alternatively, the number of transitions in the scan test signal after the threshold is reached can be limited by, for example, holding the scan test signal at the constant logic level after the threshold is reached. Numerous alternative arrangements of circuitry may be used to limit the number of transitions associated with a remaining portion of a scan test signal, and those skilled in the art will appreciate that FIG. 4 represents just one possible example of such circuitry.

The transition controller 305-1 in the FIG. 4 embodiment comprises a transition detector 405 formed using a scan flip-flop (SFF) 410 and an exclusive-or (XOR) gate 412. The scan flip-flop 410 of the transition detector 405 has a scan input (SI), a scan output (SO) and a data output (Q), although it may include additional inputs and outputs that are not explicitly shown. The XOR gate 412 has a first input coupled to the scan input SI of the scan flip-flop 410 and a second input coupled to the scan output SO of the scan flip-flop. The scan flip-flop may be viewed as an example of what is more generally referred to herein as a "scan cell." A scan cell may include a flip-flop as well as additional circuitry.

The transition controller 305-1 further comprises a counter 414, a comparator 416, a threshold register 417, an AND gate 418, a two-to-one multiplexer 420 and an AND gate 422.

The counter 414 is illustratively implemented as a Galois Field (GF) $2^n$ counter, also denoted herein as a $GF(2^n)$ counter, and will be described in greater detail below in conjunction with FIG. 5. As indicated previously, the variable n as used in the context of counter 414 is different than the variable n as used in the context of the length of the scan chains 204. The variable n for the counter in this embodiment is selected such that the desired maximum number of transitions can be counted. As one example, n in the counter context may be selected such that the maximum count value $2^n$ is approximately equal to half the chain length. As a more particular example, in the previously-described implementation in which an exemplary transition threshold is selected as 148, the $GF(2^n)$ counter 414 must be able to count to at least 148, and therefore n in this counter context would be at least 8, which would allow transition thresholds up to the maximum count of $2^8=256$ to be specified.

The comparator 416 has an input coupled to an output of the counter 414 and is configured to compare a count value at the output of the counter 414 to the specified threshold, denoted reference_count, that is stored in the threshold register 417.

The AND gate 418 controls the counter 414 responsive to outputs of the transition detector 405 and the comparator 416. More specifically, the AND gate 418 is configured to enable a counting function of the counter 414 if a transition is detected by the transition detector 405 and the comparator 416 indicates that the count value is below the threshold. The AND gate 418 has a first input coupled to the output of the XOR gate 412, a second input coupled to the output of the comparator 416, and an output coupled to a counter_enable input of the counter 414. When counter_enable is at a logic "0" value, the functionality of the counter 414 is disabled and the modified_scan_in output 402 of the transition controller 305-1 mirrors the scan_in input 400.

This feature can be used to selectively implement the transition control functionality for only a subset of scan channels, or for particular integrated circuits depending on how the die is processed. For example, some integrated circuits that are relatively fast in operating speed will have higher leakage and hence have a lower threshold on how much dynamic power can be tolerated.

In such cases, counter_enable can be enabled for all scan channels and power dissipation targets can be met by placing an upper bound on the dynamic power dissipation. For integrated circuits with slower operating speeds, since leakage would likely be lower, counter_enable can be enabled for a lesser number of scan channels, or even disabled for all of the scan channels, thereby allowing a higher dynamic power budget. This feature also allows test times to be adaptive depending on process variations, with fast parts being tested within the thermal budget using transition control and therefore taking longer to test. Slow parts could be tested faster as more scan patterns are allowed to go through without transition control.

The two-to-one multiplexer 420 is configured to select between the unmodified scan test signal scan_in and a modified scan test signal illustratively comprising the above-noted limited transition signal, responsive to the number of detected transitions reaching the specified threshold. The limited transition signal in the present embodiment is a constant logic level signal, in this case a logic "0" signal, applied to one of the inputs of the multiplexer 420. The multiplexer 420 is an example of what is more generally referred to herein as "multiplexing circuitry."

The AND gate 422 has a first input adapted to receive a scan enable signal denoted scan_enable, a second input adapted to receive a counter activation signal denoted activate_counter, and an output coupled to a reset input, denoted counter_reset, of the counter 414. The AND gate 422 is an example of what is more generally referred to herein as "reset circuitry" configured to reset the counter 414. It will be assumed that the scan_enable signal is driven to a logic "1" level to place the integrated circuit 104 in the scan shift mode of operation, and driven to a logic "0" level to place the integrated circuit 104 in the functional mode of operation. Other types and combinations of operating modes and scan enable signaling may be used in other embodiments.

In the FIG. 4 embodiment, the scan flip-flop 410 may be the first flip-flop already present on the corresponding scan channel, and the remaining circuitry 425 shown in the cloud is additional inserted logic circuitry configured to provide the transition control functionality in conjunction with scan flip-flop 410. The scan flip-flop 410 may therefore be viewed as a pipeline stage for the scan patterns that pass through the scan channel. There is typically one such scan flip-flop for each scan channel and its scan output is coupled to one of the N inputs of the decompressor 200.

The logic circuitry 425 of the transition controller 305-1 is configured to selectively send the unmodified scan test signal pattern or a modified signal comprising a static logic value depending on whether or not the number of transitions in the unmodified scan test signal pattern has reached the specified threshold.

The XOR gate 412 performs a logical exclusive-or operation on the scan input SI and scan output SO of the scan flip-flop 410. The output of this XOR gate is a logic "1" when the scan input and scan output bits have different values, which happens when there is a logic transition on the scan test signal pattern that is fed in. When there is a bit transition on the scan_in signal, the counter 414 increments the value of its count by one. The threshold register 417 holds the reference_count value that is compared to the value in the counter 414 by the comparator 416. When the value of the threshold matches the value in the counter, the value of a signal denoted not_equal is set to a logic "0." This signal is combined in AND gate 418 with the output of the XOR gate 412 to generate the counter_enable signal. The counter_enable signal is a logic "1" only when the counter 414 has not counted to the desired reference value and there has been a bit transition on scan_in.

After the desired transition count has been reached, the not_equal signal becomes a logic "0," which causes counter_enable signal to become a logic "0," such that the counter 414 stops counting. The not_equal signal is also used as the select input for the two-to-one multiplexer 420. The multiplexer 420 selects the scan_in signal when not_equal is a logic "1" and passes a constant logic "0" value when not_equal is a logic "0." Accordingly, when the desired number of transitions as defined by the threshold value has been reached, the modified_scan_in signal is held at a constant logic "0" value. Until the threshold is reached, the modified_scan_in signal mirrors the scan_in signal applied to the scan input SI of the scan flip-flop 410.

After the scan test input data associated with a given scan test pattern has been completely shifted in to the scan chains 204, the scan_enable signal becomes a logic "0." This signal is combined in AND gate 422 with the activate_counter signal to generate an active low reset for the counter 414. The activate_counter signal may also be held at a logic "0" in order to disable the transition control for the corresponding scan channel This keeps the counter 414 in reset such that modified_scan_in always mirrors scan_in.

Although only a single transition controller is 305-1 is shown in FIG. 4, it may be assumed that the remaining transition controllers 305-2 through 305-N in the transition control circuitry 203 of FIGS. 2 and 3 are each configured in substantially the same manner. Alternatively, different types of transition controllers may be used for different ones of the scan inputs of the decompressor 200.

In the FIG. 4 embodiment, the counter 414 is implemented as a $GF(2^n)$ counter, although other types of counters can be used in other embodiments. The $GF(2^n)$ counter is utilized in the FIG. 4 embodiment as opposed to a binary counter because of its reduced complexity and faster operation. The $GF(2^n)$ counter generates a sequence of residues of a certain irreducible polynomial in $GF(2^n)$ amounting to a total of $2^n-1$ residues. This allows the counter to cycle through a deterministic sequence of length $2^n-1$. Tables of irreducible trinomials or pentanomials are readily available and can be used to implement a low complexity and high speed $GF(2^n)$ counter.

Figure 5:
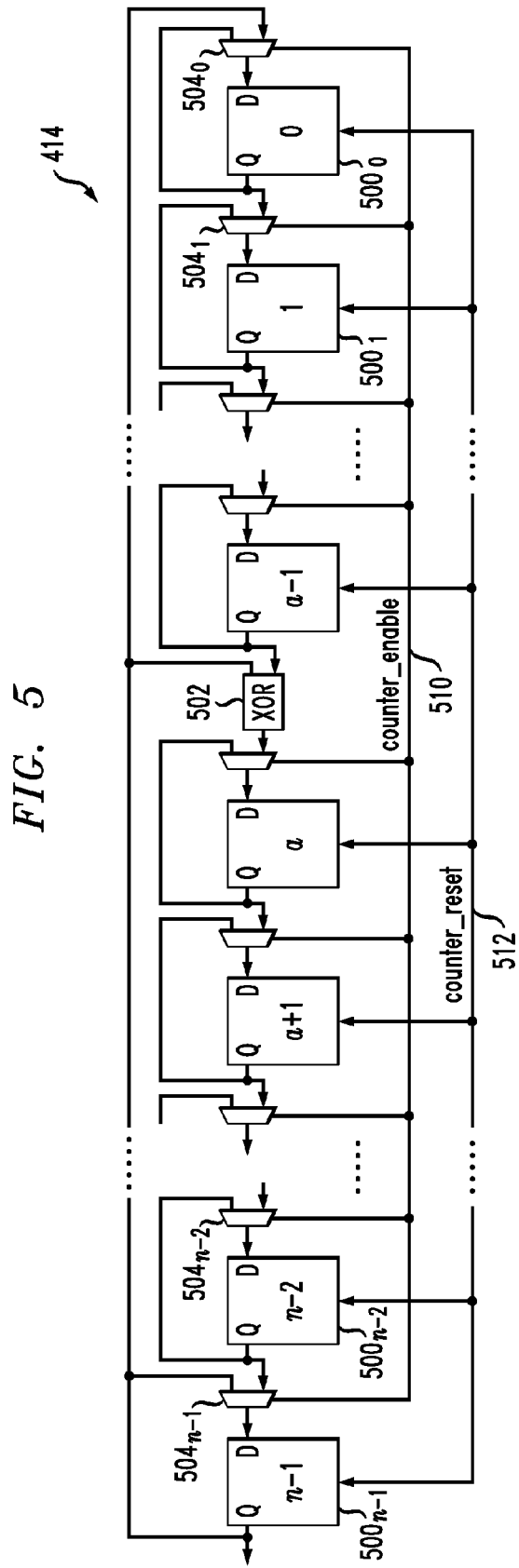
FIG. 5 is schematic diagram of a counter implemented in the portion of the transition control circuitry shown in FIG. 4.

FIG. 5 shows one possible implementation of $GF(2^n)$ counter 414 using a trinomial of the form $x^n+x^a+1$. In this implementation, counter 414 comprises n flip-flops $500_0$ through $500_{n-1}$, a single XOR gate 502, and n multiplexers $504_0$ through $504_{n-1}$. The Q output of flip-flop $500_0$ is $x_0$, the Q output of flip-flip $500_1$ is $x_1$, and so on. The Q output of flip-flop $500_{n-1}$ is combined in XOR gate 502 with the Q output of flip-flop $500_{a-1}$ and is fed via multiplexer $504_a$ to the D input of flip-flop $500_a$. Also, the Q output of flip-flop $500_{n-1}$ is fed via multiplexer $504_0$ to the D input of the flip-flop $500_0$. For the rest of the flip-flops, for any flip-flop k, the D input of flip-flop $500_k$ is fed with the Q output of flip-flop $500_{k-1}$.

Since in the exemplary transition controller 305-1 of FIG. 4 the count value is held at a constant when either the counter value reaches a certain threshold or when there are no transitions on scan_in, the multiplexers 504 are configured to hold the counter value to its previous value under these conditions. These multiplexers feed the D inputs of the flip-flops 500 as shown. The select lines 510 of the multiplexers 504 are driven by the counter_enable signal generated by AND gate 418.

As mentioned previously, the counter_reset signal is used to reset the counter 414 to a deterministic value. This is accomplished in the FIG. 5 embodiment by connecting the counter_reset signal to active low asynchronous reset inputs 512 of the flip-flops 500.

The $GF(2^n)$ counter 414 can be implemented using other types of irreducible trinomials or pentanomials. For example, an implementation using a pentanomial of the form $x^n+x^a+x^b+x^c+1$ uses three XOR gates and n flip-flops, as well as associated multiplexers. Assuming again that the flip-flops are indexed from 0 to n−1, a counter implemented using this pentanomial will have the Q output of flip-flop n−1 XOR-ed with the Q output of flip-flop a−1 and fed as D input to flip-flop a. Also, the Q output of flip-flop n−1 is XOR-ed with the Q output of flip-flop b−1 and fed as D input to flip-flop b. In addition, the Q output of flip-flop n−1 is XOR-ed with the Q output of flip-flop c−1 and fed as D input to flip-flop c. For the rest of the flip flops, for any flip-flop k, the D input of flip-flop k is fed with the Q output of flip-flop k−1.

In contrast to the exemplary $GF(2^n)$ counter implementations described above, a typical n-bit binary counter would generally require 2n XOR gates, 2n AND gates, n OR gates and n flip-flops. The worst case propagation delay is $O(n \log(n))$ for a binary counter as compared to $O(1)$ for a $GF(2^n)$ counter, thereby making the $GF(2^n)$ counter very fast, area efficient and low power.

The low power is attributable to both significantly lower leakage power and significantly lower dynamic power consumption relative to a typical binary counter. The leakage power is lower due to the significantly lower number of gates used in the $GF(2^n)$ counter. The lower dynamic power is due to the lack of carry propagation unlike binary counters where the carry ripples through any stage that can propagate a carry.

Also, carry generation creates intermediate transitions until the logic settles at the final value. These transitions are due to delay imbalances in the carry generation and propagation logic. For each scan chain where this logic is introduced, a unique threshold value is fed as input to this logic. The threshold tells how many bit transitions should be tolerated in the scan pattern before the original scan patterns are replaced with static values.

When static patterns are fed into the scan chain after the GF($2^n$) counter value matches the threshold, bit transitions are drastically reduced for the duration of time required to shift the remainder of the pattern out. This results in a significant reduction in the dynamic power dissipation of the counter. The technique essentially serves to place an upper bound on the dynamic power that can be dissipated in the scan test circuitry with the ability to set a power dissipation budget for each scan channel.

It is to be appreciated that the particular circuits shown in FIGS. 4 and 5 are presented by way of illustrative example only, and numerous alternative arrangements of transition control circuitry may be used to implement transition control functionality as disclosed herein.

The illustrative embodiments described above provide accurate and efficient control of integrated circuit power consumption during scan testing. For example, the disclosed techniques permit dynamic adjustment of the power consumption associated with particular applied scan test signals during scan testing. This reduction in scan test power consumption can be achieved without any significant negative impact on integrated circuit area requirements or functional timing requirements.

Figure 6:
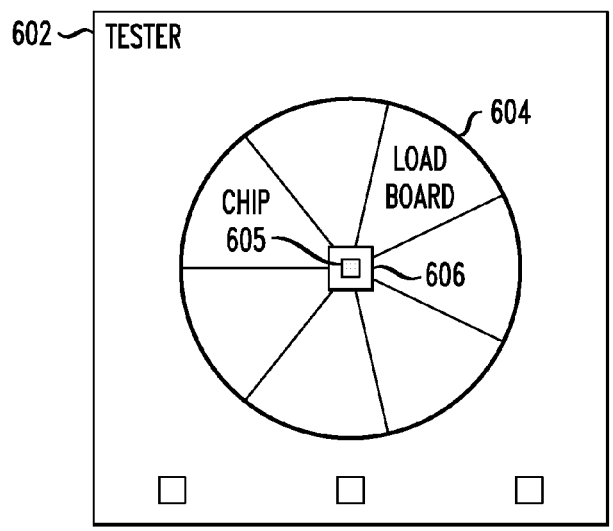
FIG. 6 shows one possible implementation of the testing system of FIG. 1.

The tester 102 in the testing system 100 of FIG. 1 need not take any particular form, and various conventional testing system arrangements can be modified in a straightforward manner to support the transition control functionality disclosed herein. One possible example is shown in FIG. 6, in which a tester 602 comprises a load board 604 in which an integrated circuit 605 to be subject to scan testing using the techniques disclosed herein is installed in a central portion 606 of the load board 604. The tester 602 may also comprise processor and memory elements for executing stored computer code, although such elements are not explicitly shown in the figure. Numerous alternative testers may be used to perform scan testing of an integrated circuit as disclosed herein. Also, as indicated previously, in alternative embodiments portions of the tester may be incorporated into the integrated circuit itself, as in a built-in self-test (BIST) arrangement.

Figure 7:
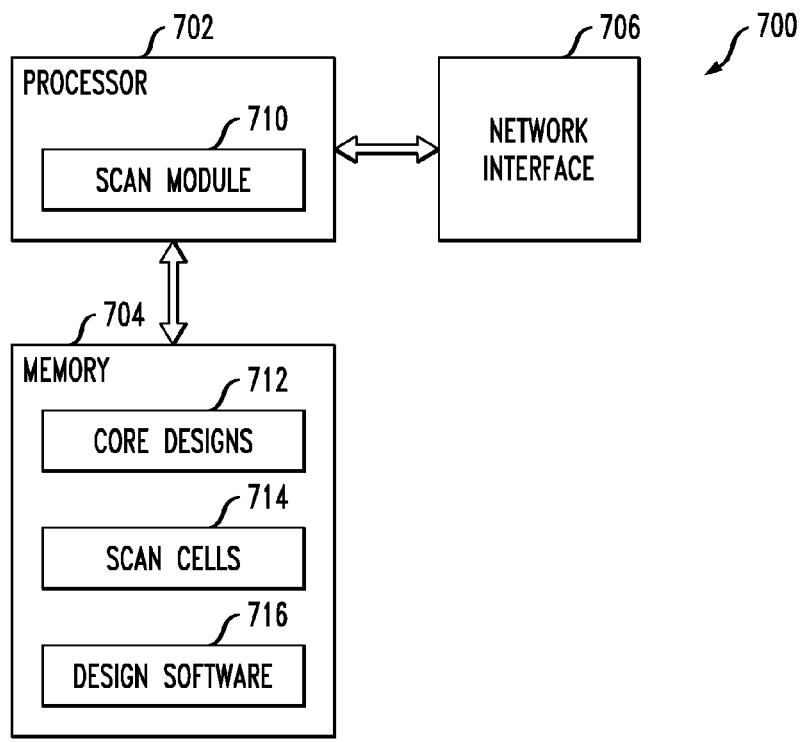
FIG. 7 is a block diagram of a processing system for generating an integrated circuit design comprising transition control circuitry of the type shown in FIGS. 3 and 4.

The insertion of scan cells to form scan chains, transition controllers and other scan test circuitry of an integrated circuit design may be performed in a processing system 700 of the type shown in FIG. 7. Such a processing system is configured for use in designing integrated circuits such as integrated circuit 104 to include scan test circuitry 106 having transition control circuitry 203. The processing system 700 comprises a processor 702 coupled to a memory 704. Also coupled to the processor 702 is a network interface 706 for permitting the processing system to communicate with other systems and devices over one or more networks. The network interface 706 may therefore comprise one or more transceivers. The processor 702 implements a scan module 710 for supplementing core designs 712 with scan cells 714 and associated transition control circuitry in the manner disclosed herein, in conjunction with utilization of integrated circuit design software 716.

By way of example, the transition controllers 305 may be generated in system 700 using an RTL description and then synthesized to gate level using a specified technology library. The resulting gate level model may then be integrated into a scan inserted integrated circuit design at a point where scan test signals from scan channel pins of the integrated circuit enter the decompressor. After insertion of the transition controllers in the integrated circuit design, a test generation model may be created for generating test patterns using a test generation tool. Control files may be used to provide the test generation tool with information such as the manner in which the counter is set and reset. Once the corresponding rules are in place, a rule checker may be run so that the test generation tool has visibility of the scan chains during the entire scan shift process, taking into account the operation of the transition controllers. Test patterns may then be generated in a conventional manner.

During test pattern generation, the test generation tool has information regarding the functionality of the transition controllers and generates expected responses for each scan channel to take such functionality into account. Thus, the expected responses will reflect the transition controllers limiting further transitions in their respective scan channels after their transition thresholds are exceeded.

Elements such as 710, 712, 714 and 716 are implemented at least in part in the form of software stored in memory 704 and processed by processor 702. For example, the memory 704 may store program code that is executed by the processor 702 to implement particular scan chain and transition control circuitry insertion functionality of module 710 within an overall integrated circuit design process. The memory 704 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 702 may comprise a microprocessor, CPU, ASIC, FPGA or other type of processing device, as well as portions or combinations of such devices.

As indicated above, embodiments of the present invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Again, it should be emphasized that the embodiments of the invention as described herein are intended to be illustrative only. For example, the invention can be implemented using a wide variety of other types of scan test circuitry, with different types and arrangements of transition control circuitry, logic gates and other circuit elements, as well as different types and arrangements of limited transition signals and other transition limitation mechanisms, than those previously described in conjunction with the illustrative embodiments. These and numerous other alternative embodiments within the scope of the following claims will be readily apparent to those skilled in the art.

What is claimed is:

1. An integrated circuit comprising:
   scan test circuitry; and
   additional circuitry subject to testing utilizing the scan test circuitry;
   the scan test circuitry comprising transition control circuitry configured to detect transitions between binary logic levels in a scan test signal, and responsive to a number of detected transitions reaching a threshold, to limit further transitions associated with a remaining portion of the scan test signal.

2. The integrated circuit of claim 1 wherein the transition control circuitry limits the further transitions associated with the scan test signal by replacing at least part of the remaining portion of the scan test signal with a limited transition signal.

3. The integrated circuit of claim 2 wherein the transition control circuitry comprises multiplexing circuitry configured to select between the scan test signal and the limited transition signal responsive to the number of detected transitions reaching the threshold.

4. The integrated circuit of claim 2 wherein the limited transition signal is maintained at a constant binary logic level and therefore has no transitions.

5. The integrated circuit of claim 1 wherein the transition control circuitry comprises:
a transition detector;
a counter;
a comparator having an input coupled to an output of the counter and configured to compare a count value at the output of the counter to the threshold; and
logic circuitry for controlling the counter responsive to outputs of the transition detector and the comparator;
wherein the logic circuitry is configured to enable a counting function of the counter if a transition is detected by the transition detector and the comparator indicates that the count value is below the threshold.

6. The integrated circuit of claim 5 wherein the transition control circuitry further comprises reset circuitry configured to reset the counter responsive to at least a scan enable signal.

7. The integrated circuit of claim 6 wherein the reset circuitry comprises an AND gate having a first input adapted to receive the scan enable signal, a second input adapted to receive a counter activation signal, and an output coupled to a reset input of the counter.

8. The integrated circuit of claim 5 wherein the transition detector comprises:
a scan cell having a scan input and a scan output; and
an XOR gate having a first input coupled to the scan input of the scan cell and a second input coupled to the scan output of the scan cell.

9. The integrated circuit of claim 8 wherein the logic circuitry comprises an AND gate having a first input coupled to output of the XOR gate, a second input coupled to the output of the comparator, and an output coupled to a counter enable input of the counter.

10. The integrated circuit of claim 5 wherein the counter comprises a $GF(2^n)$ counter implemented in accordance with one of a trinomial of the form $x^n+x^a+1$ and a pentanomial of the form $x^n+x^a+x^b+x^c+1$.

11. The integrated circuit of claim 1 wherein the transition control circuitry comprises a plurality of transition controllers for respective ones of a plurality of scan test signals, with each of the transition controllers being configured to detect transitions between binary logic levels in a corresponding one of the scan test signals, and responsive to a number of detected transitions in that scan test signal reaching a threshold, to limit further transitions associated with a remaining portion of the scan test signal.

12. The integrated circuit of claim 11 wherein the scan test circuitry further comprises:
a decompressor;
a compressor; and
a plurality of scan chains arranged in parallel with one another between respective outputs of the decompressor and respective inputs of the compressor;
wherein the transition controllers are associated with respective inputs of the decompressor;
wherein the scan test signals, as modified by any transition limitations implemented by the respective transition controllers, are applied to respective inputs of the decompressor;
wherein scan test input data from the decompressor based on the modified scan test signals is shifted into the scan chains for use in the scan testing; and
wherein scan test output data indicative of results of the scan testing is subsequently shifted out of the scan chains into the compressor.

13. The integrated circuit of claim 12 wherein the threshold is determined as a function of the number of scan cells in a given one of the scan chains.

14. A disk drive controller comprising the integrated circuit of claim 1.

15. A method comprising:
detecting transitions between binary logic levels in a scan test signal; and
responsive to a number of detected transitions reaching a threshold, limiting further transitions associated with a remaining portion of the scan test signal;
wherein said detecting transitions and limiting further transitions are performed by scan test circuitry comprising transition control circuitry.

16. The method of claim 15 wherein said limiting further transitions further comprises replacing at least part of the remaining portion of the scan test signal with a limited transition signal.

17. The method of claim 16 wherein the limited transition signal is maintained at a constant binary logic level and therefore has no transitions.

18. A computer program product comprising a non-transitory computer-readable storage medium having computer program code embodied therein for use in scan testing an integrated circuit, wherein the computer program code when executed in a testing system causes the testing system to perform the steps of the method of claim 15.

19. A processing system comprising:
a processor; and
a memory coupled to the processor and configured to store information characterizing an integrated circuit design;
wherein the processing system is configured to provide within the integrated circuit design scan test circuitry, the scan test circuitry comprising transition control circuitry configured to detect transitions between binary logic levels in a scan test signal, and responsive to a number of detected transitions reaching a threshold, to limit further transitions associated with a remaining portion of the scan test signal.

20. The system of claim 19 wherein the transition control circuitry comprises multiplexing circuitry configured to select between the scan test signal and a limited transition signal responsive to the number of detected transitions reaching the threshold.

* * * * *